(12) United States Patent
Farooq et al.

(10) Patent No.: US 7,299,530 B2
(45) Date of Patent: Nov. 27, 2007

(54) BALL GRID ARRAY REWORK USING A CONTINUOUS BELT FURNACE

(75) Inventors: Mukta G. Farooq, Hopewell Junction, NY (US); Ray A. Jackson, Beacon, NY (US); David C. Linnell, Poughkeepsie, NY (US); Frank L. Pompeo, Redding, CT (US)

(73) Assignee: International Business Machines Corporation, Armonk, NY (US)

( * ) Notice: Subject to any disclaimer, the term of this patent is extended or adjusted under 35 U.S.C. 154(b) by 465 days.

(21) Appl. No.: 10/680,622

(22) Filed: Oct. 7, 2003

(65) Prior Publication Data

US 2005/0071993 A1    Apr. 7, 2005

(51) Int. Cl.
*B23P 19/04* (2006.01)

(52) U.S. Cl. .................. 29/403.3; 29/403.4; 29/840; 29/762

(58) Field of Classification Search .................. 29/839, 29/840, 843, 762, 403.3, 403.4
See application file for complete search history.

(56) References Cited

U.S. PATENT DOCUMENTS

| 6,063,188 | A | * | 5/2000 | Heid ........................... 117/200 |
| 6,497,357 | B2 | | 12/2002 | Jackson et al. |
| 6,539,618 | B1 | | 4/2003 | Lyke |

* cited by examiner

*Primary Examiner*—Richard Chang
(74) *Attorney, Agent, or Firm*—Gibb & Rahman, LLC; Ira D. Blecker, Esq.

(57) ABSTRACT

Disclosed is an apparatus for separating interconnects between, for example, a card and a substrate. The apparatus includes one or more rotationally biased (e.g., spring-loaded, etc.) partial-circle structures (e.g., blades, squeegee, plow, etc.) and one or more temperature-sensitive releases connected to the partial-circle structures. The partial-circle structures are positioned to rotate and separate the interconnects when released by the temperature-sensitive releases. The invention can also include solder reservoirs positioned to receive solder from the interconnects separated by the partial-circle structures.

7 Claims, 4 Drawing Sheets

BALL GRID ARRAY REWORK USING A CONTINUOUS BELT FURNACE

BACKGROUND OF THE INVENTION

1. Field of the Invention

The present invention generally relates to an apparatus and method for separating integrated circuit structures connected by interconnects such as ball grid arrays and column grid arrays.

2. Description of the Related Art

Ball Grid Arrays (BGA) and Column Grid Arrays (CGA) are widely used to electrically and mechanically connect substrates (typically ceramic) carrying semiconductor chips to a card. The BGA commonly consists of an array of metal balls which are soldered to a substrate by means of a solder fillet material. The solder fillet material is typically of a lower melting temperature (183 C for eutectic Pb/Sn) than the solder ball (~280 to 300 C) which it is joining to, enabling the solder ball not to melt during joining. However, the solder ball and fillet material may be of the same composition, thus causing the entire interconnect to reach liquidous temperature during the reflow. During the manufacturing process, a substrate, either organic or ceramic, is attached to a carrier. Typically, this carrier is organic and may be comprised of FR4 like material, or may have Surface Laminar Circuitry (SLC) on a core made of other organic material. If the substrate requires rework, such as because of a defective chip, the substrate must first be removed from the carrier.

One conventional method to remove a substrate from a card uses hot gas. In such a method, a gas, typically nitrogen, is heated to high temperatures and impinged upon the substrate. The tooling for such an operation is dedicated. Further, such an operation is typically performed in batch mode. There are numerous problems with employing such a method when removing a ceramic substrate from an organic carrier. First, hot gas uses a significantly greater amount of thermal energy that is transmitted to the top surface of the substrate. Such high temperatures can damage the still good chips atop the substrate, or make failure analysis for the defective chips not possible. The former situation may arise when the substrate has two or more chips, with one being defective, and the others being good. More importantly, such methods cannot be used for higher liquidous temperature alloys, such as those being developed for lead free applications, because the higher amount of heat input would damage organic boards which typically cannot exceed temperatures greater than 250 C. As an example, a lead-free alloy comprising Sn, Ag and Cu (95.5 wt % Sn, 3.8 wt % Ag and 0.7 wt % Cu) has a liquidous temperature equal to approximately 217 C. The hot gas technique can cause excessively high temperatures at the organic board or carrier surface, when it attempts to melt this lead-free alloy which resides between the ceramic substrate and organic board. Thus, a need exists to separate the substrate from the carrier while preserving its ability to be rejoined to another carrier.

SUMMARY OF THE INVENTION

The invention provides an apparatus for separating interconnects between, for example, a card and a substrate. The apparatus includes one or more rotationally biased (e.g., spring-loaded, etc.) partial-circle structures (e.g., blades, squeegee, plow, etc.) and one or more temperature-sensitive releases in contact with the partial-circle structures. The partial-circle structures are positioned externally to the interconnect area and rotate though the interconnect area and separate the interconnects when released by the temperature-sensitive releases. The invention can also include solder reservoirs positioned to receive the removed solder from the interconnects that are separated by the partial-circle structures.

The rotational paths of the partial-circle structures can partially overlap. Each of the temperature-sensitive releases can be different, such that each of the partial-circle structures is released at a different temperature. Thus, the partial-circle structures will rotate sequentially (at different times) to prevent any potential contact between rotating partial-circle structures.

The workpiece (e.g., carrier and substrate having one or more integrated circuit chips) is positioned between the partial-circle structures. The partial-circle structures rotate around axis external to the workpiece. The partial-circle structures pass between two parts of the workpiece (e.g., between the carrier and substrate and/or between the chip and substrate) when released by the temperature-sensitive releases. The partial-circle structures break interconnects between such parts of the workpiece when released by the temperature-sensitive releases. The temperature-sensitive releases are adapted to release the partial-circle structures at temperatures above a melting point of the interconnects.

Thus, the inventive apparatus separates devices joined with interconnects. The invention provides partial-circle structures that rotate and pass between the devices to be separated. The partial-circle structures can be released sequentially and the interconnect material that is remove from the interconnect region by the partial circle structure is collected in reservoirs to prevent contamination of surrounding devices and/or the tool. The invention simplifies and reduces the cost of separating devices by providing an apparatus in which the workpiece can be easily mounted and thereafter placed in any conventional heating tool. The invention operates automatically and on its own to break the interconnects at the proper temperature. Further, the invention holds separated devices after removing the interconnections to allow the devices to be easily inspected and reworked.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1A:
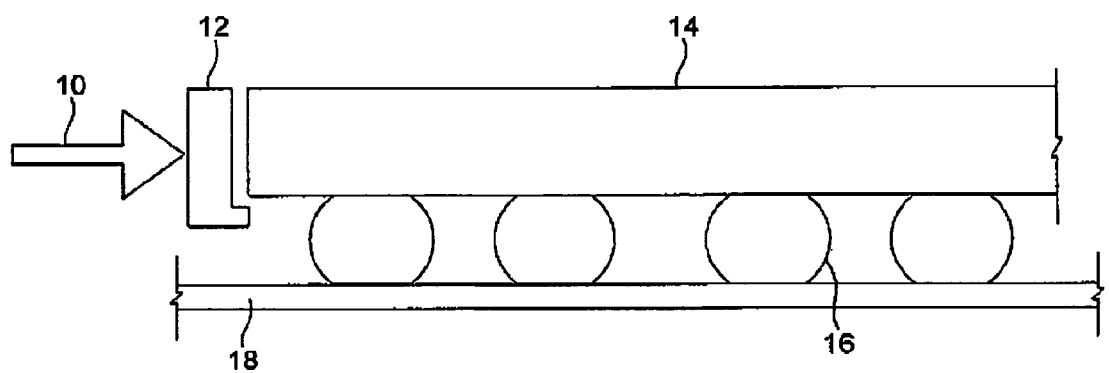
FIGS. 1A and 1B are schematic diagrams of interconnections between a substrate and a carrier.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

The invention provides a method and apparatus that separates interconnections between a substrate and an underlying carrier. Although ball grid array (BGA) interconnects are discussed below, the invention can equally be applied to other interconnect structures such as column grid arrays (CGA), etc. The invention provides a low cost, highly reliable method/apparatus that can easily be employed with existing tools (e.g., continuous belt furnace).

Figure 1B:
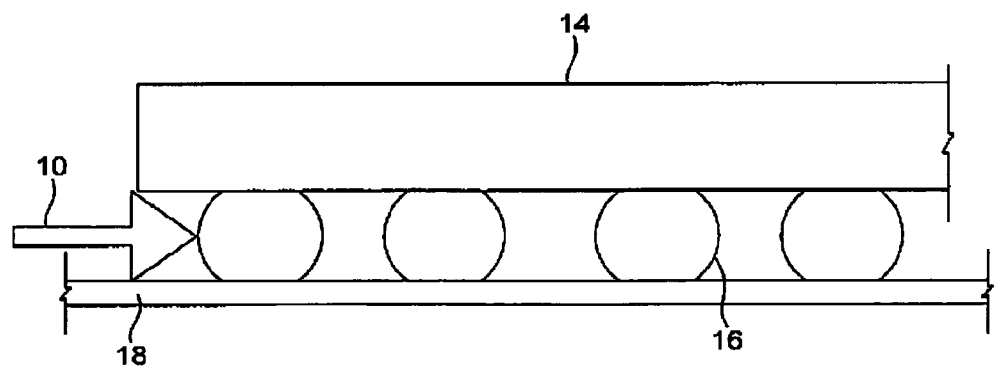
Figure 2:
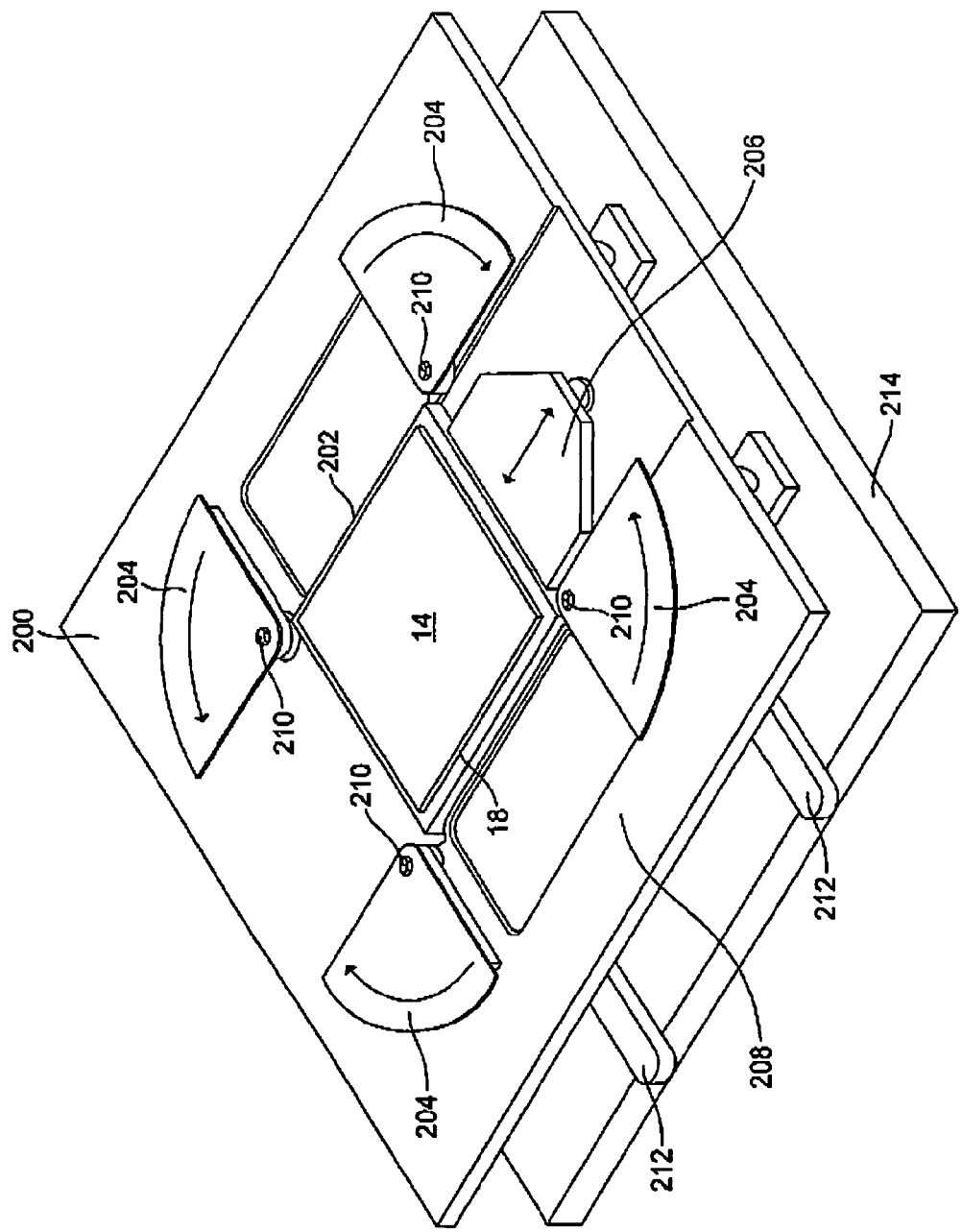
FIG. 2 is a perspective schematic drawing of the inventive interconnection removal device.
Figure 3:
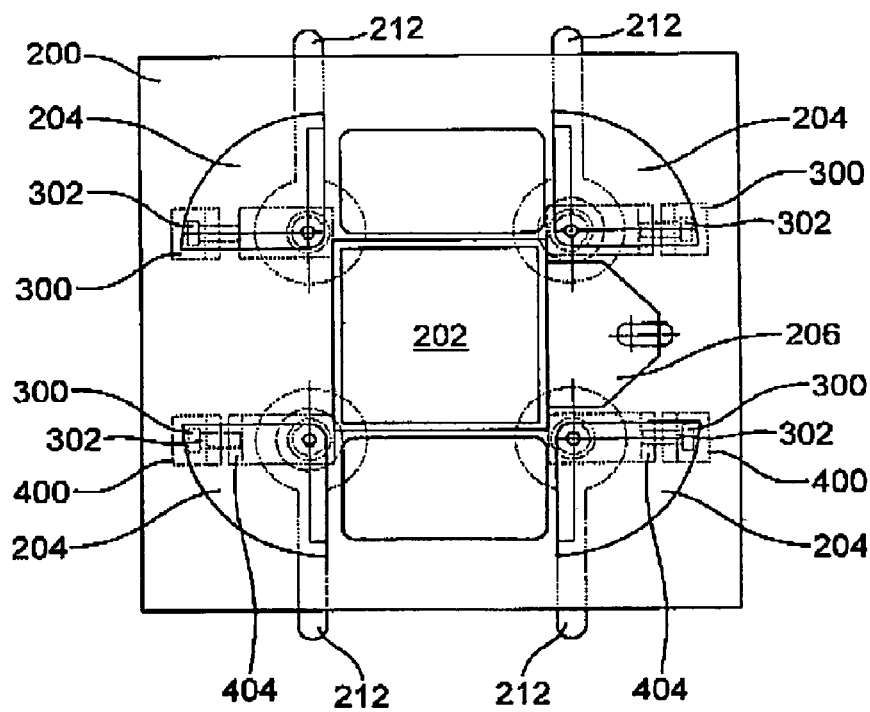
FIG. 3 is a top-view schematic drawing of the inventive interconnection removal device.

FIGS. 1A and 1B illustrate devices 14, 18 connected by solder balls 16 in a ball grid array. For example, device 14 could be a substrate connected to a carrier 18. Alternatively, device 14 could comprise an integrated circuit chip mounted on a substrate 18. In both drawings, arrow 10 represents a separating force. The separating force 10 can be applied to device 14 through separator/clamp 12 or can be applied to the interconnects 16. The invention described below provides an apparatus that moves structures through the interconnects 16 (as shown FIG. 1B) to break the interconnects 16. However, the invention can also apply the separating force 10 shown in FIG. 1A to the device 14 to further assist in separating the devices 14, 18.

With the invention, the substrate and carrier are placed into a holding fixture/apparatus 200 (FIGS. 2-5). The apparatus includes one or more rotationally biased (e.g., spring-loaded, etc.) partial-circle structures 204 (e.g., half or quarter-wheel blades, squeegees, plows, etc.) and one or more temperature-sensitive releases 300, 302 (FIG. 3) in contact with connected to the partial-circle structures 204. The partial-circle structures 204 are positioned to rotate and separate the interconnects 16 between the upper portion 14 (e.g., the substrate, chip, etc.) and the lower portion 18 (e.g., card (carrier), substrate, etc.) of the workpiece 202 when released by the temperature-sensitive releases 300, 302. Item 200 represents the upper part of the frame of the apparatus and item 214 represents the lower part of the frame of the apparatus.

The invention can also include solder reservoirs 208 positioned to receive solder from the interconnects separated by the partial-circle structures. When the partial-circle structures 204 pass between the upper device 14 and the lower device 18, they push solder out from between the two devices 14, 18. The solder reservoirs 208 collect the solder as it is pushed out from between the devices 14, 18. Thus, the solder reservoirs 208 collect the solder that was previously used to form the interconnects to prevent the solder from contaminating the tools in which the apparatus will be used and/or adjacent devices.

The carrier 18 is locked into place, using product clamp 206, and a top arm (e.g., structure 12 or a similar structure) grips and locks the substrate 14 into a stationary position. At each corner of the carrier/substrate 202, a quarter wheel 204 is spring loaded (rotationally biased). In one example, the thickness of each quarter wheel 204 can be approximately 0.010", but could be more or less depending on the specific application. The partial-circle structures 204 can be made of several possible materials, such as tungsten, high temperature rubber, etc.

The workpiece 202 (e.g., carrier 18 and substrate 14 having one or more integrated circuit chips) is positioned between the partial-circle structures 204. The partial-circle structures 204 rotate around axis (axel) 210 external to the workpiece 202. Preferably, the axis 210 are positioned to be directly adjacent to each of the corners of the workpiece 202. The partial-circle structures 204 pass between two parts of the workpiece 202 (e.g., between the carrier 18 and substrate 14 and/or between the chip 14 and substrate 18) when released by the temperature-sensitive releases 300.

The temperature-sensitive releases 300 are adapted to release the partial-circle structures at temperatures close to or above the melting point of the interconnects. Therefore, the interconnects 16 are substantially softened or liquefied before the releases 300 release the partial-circle structures 204.

Figure 5:
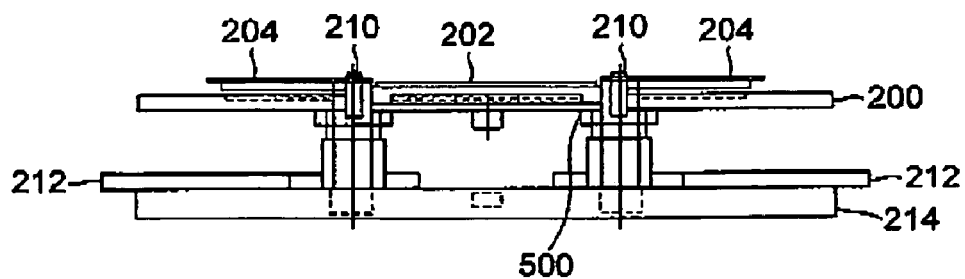
FIG. 5 is a side-view schematic drawing of the inventive interconnection removal device.

The temperature-sensitive releases 300 comprise actuation devices that can use bimetallic discs 302 to push a pin 300 out of an opening within a bracket 404. The bracket 404 is connected to the axis (axle) 210 about which the partial-circle structures 204 rotate through member 406. In addition, FIG. 5 illustrates a rotational shaft bushing 500 within which the shaft (axel) 210 rotates. The bracket 404 is rotationally biased by the spring 402. When the pin 300 is released from the opening in the bracket 404, the axle 210 rotates by operation of the force of the spring 402 which causes the partial-circle structure 204 to rotate and pass between the upper device 14 and the lower device 18, thereby separating the interconnects 16 between the devices 14, 18.

Figure 4:
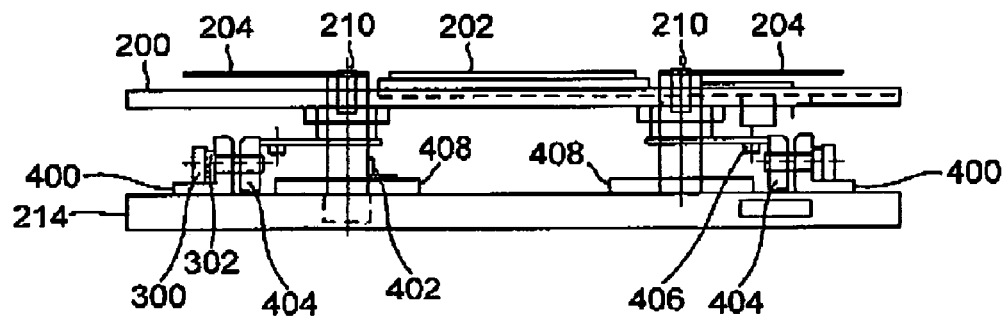
FIG. 4 is a side-view schematic drawing of the inventive interconnection removal device.

The rotational movement of the bracket 404 is limited by a stop member, such as the axel base 408 shown in FIG. 4. Therefore, in one embodiment, the partial-circle structures 204 will only pass between the upper 14 and lower 18 devices a single time and will stop rotating after having passed between the devices (when the bracket 404 rotates into contact with the axle base 408). As would be readily understood by one ordinarily skilled in the art, other similar structures can be used to control the rotation of the bracket 404 and partial-circle structure 204.

The torsion spring adjusters 212 allow the bracket 404 and the partial-circle structures 204 to be returned to their rotationally biased position. After being returned to the rotationally biased position, the pin 300 is inserted through the opening in the bracket 404 to maintain the bracket 404 and partial-circle structure 204 in the rotationally biased position.

At a prescribed temperature range, the bimetallic discs 302 actuate the quarter wheels 204. In other words, the bimetallic discs 302 expand when heated and push the head of the pin 300 against bracket 400 which causes the pin 300 to move out of the opening in the bracket 404. The apparatus can be used with a continuous belt furnace which heats the interconnects 16 and the bimetallic discs 302. Upon reaching liquefaction of the interconnect metal or alloy 16, the quarter wheel 204 then sweeps through the gap between the substrate 14 and the carrier 18. In doing so, the quarter wheel 204 wipes the interconnects and removes the interconnects from the package, and disposes the material into the reservoir 208. While bimetallic discs 302 are discussed above, as would be recognized by one ordinarily skilled in the art, other devices such as springs, etc. could be utilized instead of bimetallic discs as the force trigger applied to the wheels.

Expansion of each bimetallic disc 302 is timed such that each quarter wheel 204 is actuated in series mode, one after another so as not to interfere with each other. Thus, each of the temperature-sensitive releases 302 can be different, such that each of the partial-circle structures is released at a different temperature (and different point in time). As the apparatus 200 is moved along the belt within a furnace, the temperature gradually increases. At each temperature increase, a different partial-circle structure 204 is released, as controlled by each different temperature-sensitive release 302. Thus, the partial-circle structures could rotate sequentially (at different times) to prevent any potential contact between rotating partial-circle structures. After the last quarter wheel 204 sweeps through and removes the last of the interconnects 16, the top arm 12 holds the substrate 14 and prevents it from falling onto the carrier 18.

Figure 6:
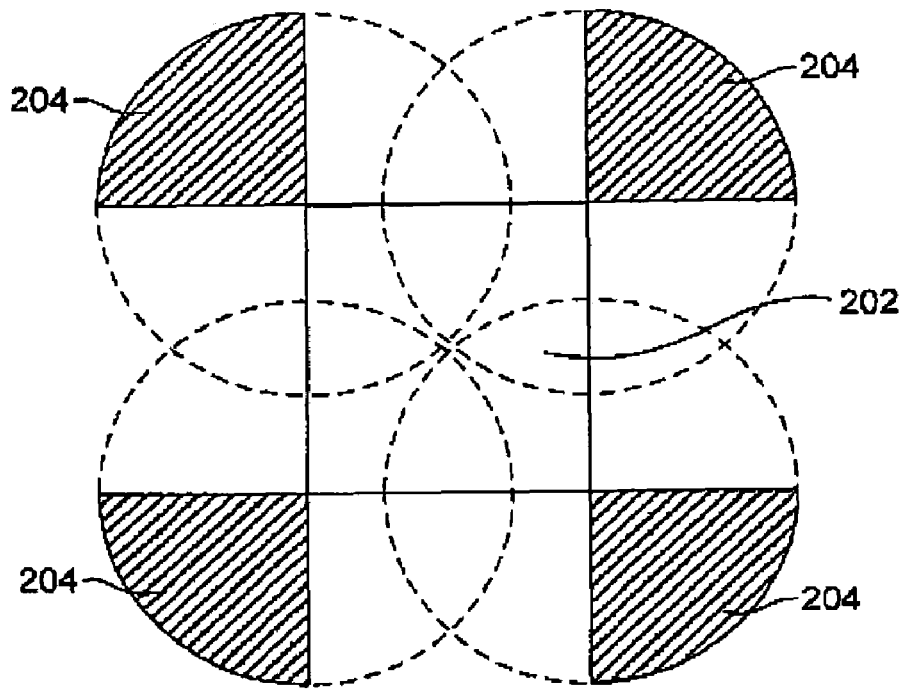
FIG. 6 is a schematic drawing of the paths through which the partial circle structures rotate.
Figure 7:
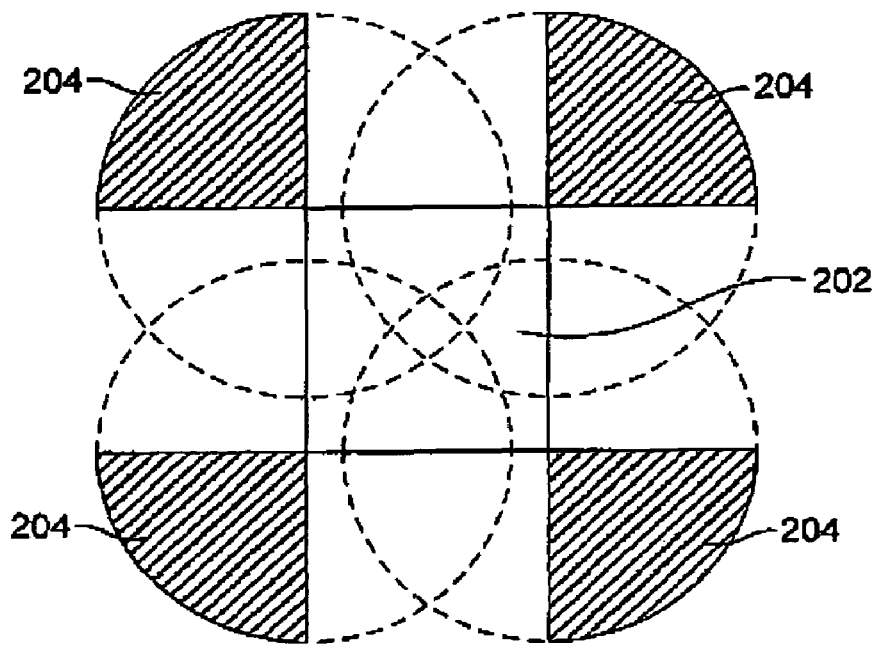
FIG. 7 is a schematic drawing of the paths through which the partial circle structures rotate.

As shown in FIGS. 6 and 7, the rotational paths of the partial-circle structures 204 may partially overlap. More specifically, FIG. 6 illustrates four equally-sized partial-circle structures 204. The rotational paths are shown using dashed lines. As can be seen in FIG. 6, the paths of the partial-circle structures 204 reach to the center of the workpiece 202 and will contact substantially all interconnect structures 16. FIG. 7 illustrates an example where the partial-circle structures 204, 700 are larger relative to the workpiece 202. As shown in FIG. 7, all four paths substantially overlap the center of the workpiece, thereby insuring that all interconnect structures 16 are separated. FIG. 6 provides a benefit that the partial-circle structures 204 will not interfere with one another and can be actuated (rotated) simultaneously. To the contrary, while the larger partial-circle structures 204, 700 sweep through a larger area of the workpiece 202 and insure that all interconnect structures 16 are removed, such partial-circle structures 204, 700 must be actuated (rotated) sequentially to avoid contacting each other.

FIG. 7 also illustrates that the partial-circle structures 700 do not have to be quarter-wheels (quarter-disks). To the contrary, partial-circle structures 700 are half-disks. As would be understood by one ordinarily skilled in the art, any portion of a circle (disc) can be used depending upon the specific design requirements. Therefore, potentially any size from ¾ disk down to a very small disk portion (e.g. 1/100 disk) can be utilized. In addition, the partial-circle structures 204 can be replaced with any shaped device, such as a knife, stiff wire, squeegee, plow, etc. that has the capability of removing the solder from between the substrate 14 and the carrier 18.

In addition, the partial-circle structures 204 do not all have to be the same size. Therefore, for example, smaller partial-circle structures could be passed between the substrate 14 and carrier 18 followed by larger partial-circle structures (or vice versa) in an effort to more completely remove all solder material from between the substrate 14 and carrier 18. In addition, the invention is not limited to using four of such a partial-circle structures. Instead, any number (e.g., 1-6, or more) of such structures can be utilized depending upon the shape, size, etc. of the workpiece 202. For example, one large wheel could be substituted for the plurality of wheels described. Further, the invention can be used in serial mode with multiple fixtures, limited only by the capacity of the belt furnace. Also, while ball grid arrays are used in the previous example, one ordinarily skilled in the art would readily understand that the interconnect being removed, could be any type of interconnect, such as column grid arrays, etc. In addition, the melting points and temperature hierarchies are listed for Pb solder systems, but could be expanded to Pb free systems.

The invention described above provides an apparatus for separating devices joined with interconnects. The invention provides partial-circle structures that rotate and pass between the devices to be separated. The partial-circle structures can be released sequentially and the interconnect material is collected in reservoirs to prevent contamination of surrounding devices and/or the tool. The invention simplifies and reduces the cost of separating devices by providing an apparatus in which the workpiece can be easily mounted and thereafter placed in any conventional heating tool. The invention operates automatically and on its own to break the interconnects at the proper temperature. Further, the invention holds separated devices after removing the interconnections to allow the devices to be easily inspected and reworked.

While the invention has been described in terms of preferred embodiments, those skilled in the art will recognize that the invention can be practiced with modification within the spirit and scope of the appended claims.

What is claimed is:

1. An apparatus comprising:
   a frame;
   at least one partial-circle structure above said frame; and
   at least one temperature-sensitive release operably connected to said at least one partial-circle structure,
   wherein said frame is configured to hold a workpiece having two parts connected by interconnects such that said at least one partial-circle structure is positioned to pass between said two parts and break said interconnects when released by said at least one temperature-sensitive release,
   further comprising at least one axle extending vertically through an upper part of said frame and connected to said at least one partial circle structure, wherein said at least one axle is spring-loaded to rotate such that said at least one partial circle structure rotates and passes between said two parts and breaks said interconnects when released by said at least one temperature sensitive release.

2. The apparatus in claim 1, wherein said at least one partial-circle structure comprises a plurality of partial-circle structures operably connected to a plurality of temperature-sensitive releases, and
   each of said temperature-sensitive releases are different, such that each of said partial-circle structures is released at a different temperature.

3. The apparatus in claim 1, wherein said at least one partial-circle structure comprises a plurality of partial-circle structures operably connected to a plurality of temperature-sensitive releases, and
   wherein rotational paths of said partial-circle structures partially overlap.

4. The apparatus in claim 1, wherein said at least one partial-circle structure comprises a plurality of partial-circle structures operably connected to a plurality of temperature-sensitive releases, and wherein said workpiece is positioned between said partial-circle structures.

5. The apparatus in claim 1, wherein said at least one partial-circle structure comprises less than a three-quarter portion of a disc that is approximately 0.01 inches thick.

6. The apparatus in claim 1, wherein said temperature-sensitive release is adapted to release said partial-circle structure at a temperature above a melting point of said interconnects.

7. The apparatus of claim 1, wherein said two parts comprise one of a chip and substrate and a substrate and carrier and wherein said frame further comprises at least one reservoir positioned to receive material from said interconnects broken by said at least one partial-circle structure.

* * * * *